(12) United States Patent
Ruckerbauer et al.

(10) Patent No.: US 6,677,813 B2
(45) Date of Patent: Jan. 13, 2004

(54) INTEGRATED CIRCUIT FOR RECEIVING A CLOCK SIGNAL, PARTICULARLY FOR A SEMICONDUCTOR MEMORY CIRCUIT

(75) Inventors: Hermann Ruckerbauer, Moos (DE); Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,728

(22) Filed: Jul. 1, 2002

(65) Prior Publication Data

US 2003/0001665 A1 Jan. 2, 2003

(30) Foreign Application Priority Data

Jun. 29, 2001 (DE) .......................................... 101 31 708

(51) Int. Cl.7 ................................................. H03B 1/00
(52) U.S. Cl. ..................................................... 327/553
(58) Field of Search ................................ 327/551, 552, 327/553, 557, 558, 559

(56) References Cited

U.S. PATENT DOCUMENTS

| | | | | |
|---|---|---|---|---|
| 5,355,091 A | * | 10/1994 | Albert et al. | ................ 327/553 |
| 6,307,427 B1 | * | 10/2001 | Yamazaki et al. | ........... 327/553 |
| 6,433,625 B1 | * | 8/2002 | Savage | ........................ 327/551 |

* cited by examiner

Primary Examiner—Jeffrey Zweizig
(74) Attorney, Agent, or Firm—Laurence A. Greenberg; Werner H. Stemer; Gregory L. Mayback

(57) ABSTRACT

An integrated circuit for receiving a clock signal is described and has a clock input and a receiver circuit. A clock signal can be applied to the clock input. A filter circuit is provided, whose input is connected to the clock input for the purpose of filtering out a frequency and/or a frequency range of the clock signal. An output of the filter circuit, which output produces the filtered clock signal, is connected to the receiver circuit for the purpose of transferring the filtered clock signal to the integrated circuit for processing.

9 Claims, 1 Drawing Sheet

INTEGRATED CIRCUIT FOR RECEIVING A CLOCK SIGNAL, PARTICULARLY FOR A SEMICONDUCTOR MEMORY CIRCUIT

BACKGROUND OF THE INVENTION

Field of the Invention

The invention relates to an integrated circuit for receiving a clock signal, particularly for receiving a clock signal that is subject to interference. The integrated circuit can be used in conjunction with a memory circuit.

Signals on data lines, such as data signals, clock signals or the like, are subject to influences from the environment that interfere with the signals. In particular, high-frequency signals are particularly susceptible to environmental influences.

Data are frequently transferred to a semiconductor memory circuit synchronously, i.e. with respect to a clock signal. A critical factor in this context is the instant in time at which the data signal is transferred to a reception circuit. The instant is determined by an edge of the clock signal, couched in more precise terms the instant at which the data signal is transferred is determined by the appearance of a particular voltage level at a clock input. If external interference influences the clock signal, then the instant at which the data signal is transferred to the reception circuit moves, which can result in errors when transferring the data signal.

SUMMARY OF THE INVENTION

It is accordingly an object of the invention to provide an integrated circuit for receiving a clock signal that overcomes the above-mentioned disadvantages of the prior art devices of this general type, which can be used to minimize interference in a clock signal and where the clock signal can be reliably used to transfer a data signal.

With the foregoing and other objects in view there is provided, in accordance with the invention, an integrated circuit. The circuit contains a clock input for receiving a clock signal, a receiver circuit, and a filter circuit having an input connected to the clock input for filtering out a frequency and/or a frequency range of the clock signal. The filter circuit has an output and generates a filtered clock signal available at the output. The output is connected to the receiver circuit and the receiver circuit receives the filtered clock signal. The receiver circuit forwards the filtered clock signal for further processing.

The integrated circuit in accordance with the invention has a clock input and a receiver circuit, with a clock signal being able to be applied to the clock input. A filter circuit is provided between the clock input and the receiver circuit for the purpose of filtering out a frequency range of the clock signal. The filtered clock signal is routed to the receiver circuit in order to transfer the filtered clock signal to the integrated circuit for processing.

Normally, interference signals prevail in clock signals in one or more particular frequency ranges. Such interference is able to corrupt the clock signal such that a latch instant, i.e. the instant at which data are transferred to a data latch, for example, is offset from an ideal latch instant. The inventive integrated circuit has the advantage that the clock signal is filtered by a filter circuit, such that the frequency range in which interference predominantly occurs is filtered out by the filter circuit. The filtered clock signal is then supplied to a receiver circuit, after which it can be used for transferring data in a data signal.

The use of such a filter circuit for removing interference from data signals is not all that useful, however, since the interference limited to a particular frequency range has only little influence on the quality of the data signal.

Preferably, provision can be made for the filter circuit to be controlled by a control circuit. To this end, the control circuit can have a setting memory which stores setting values, with the control circuit controlling the filter circuit on the basis of the setting values. This has the advantage that the integrated circuit for receiving the clock signal can be matched to the particular preferred interference arising. The circuit is matched by storing setting values in the setting memory, and the matching defines frequencies or frequency ranges which are masked from the clock signal by the filter circuit.

The receiver circuit preferably has a differential amplifier circuit that is able to compare the signal voltage level with a reference voltage level and to assign an instantaneous signal value to the instantaneous signal voltage level. When the inventive integrated circuit has filtered out the fundamental interference signals from the clock signal, the edges of the clock signal essentially correspond to the edge of the ideal clock signal, so that the instant at which the signal value of the clock signal changes is not affected by interference.

Preferably, provision can also be made for the filter circuit to be implemented in a digital circuit, as a result of which frequencies or frequency ranges that are to be filtered out can be set very precisely. There is thus no need to vary analog components for an analog filter circuit.

Other features which are considered as characteristic for the invention are set forth in the appended claims.

Although the invention is illustrated and described herein as embodied in an integrated circuit for receiving a clock signal, particularly for a semiconductor memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
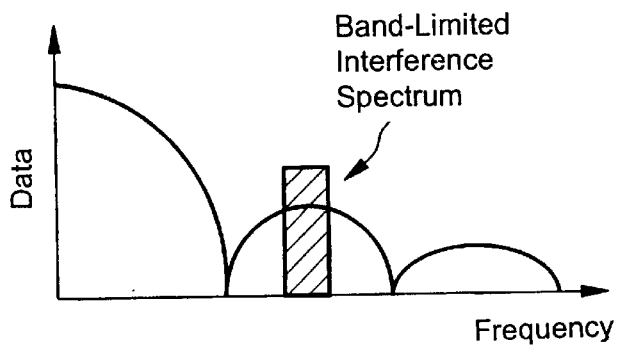
FIG. 1A is a graph showing a frequency spectra for a data signal.
Figure 1B:
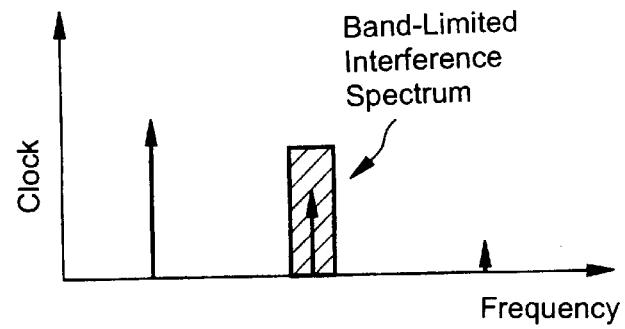
FIG. 1B is a graph showing a frequency spectra for a clock signal.

Referring now to the figures of the drawing in detail and first, particularly, to FIGS. 1A and 1B thereof, there is shown a graph highlighting differences in a frequency spectra between a data signal and a clock signal. The frequency spectrum for a data signal is essentially continuous and is essentially defined by a quality of the signal, i.e. how close the data signal comes to an ideal data signal shape, and by the frequency with which the voltage levels determining the logical data value change. An interference signal in a particular frequency range has only very little effect on the signal quality of the data signal, since the data signal itself has a very broad bandwidth, and hence only a small proportion of the signal is subject to interference.

In contrast, the clock signal is harmonic. The frequency spectrum of the clock signal shows only amplitudes at discrete frequencies (multiples of the fundamental frequency), i.e. at the fundamental frequency and at the respective harmonics. If there is an interference signal with the corresponding frequency range above one of the harmonics, the harmonic is overlaid, as a result of which the clock signal becomes severely corrupted, since a considerable proportion of the total signal is affected. An interference signal thus has considerable effects on the quality of the clock signal, which results in that the data signal can be transferred to the integrated circuit more reliably.

It is therefore appropriate to provide different input circuits for transferring data signals and clock signals to an integrated circuit.

Figure 2:
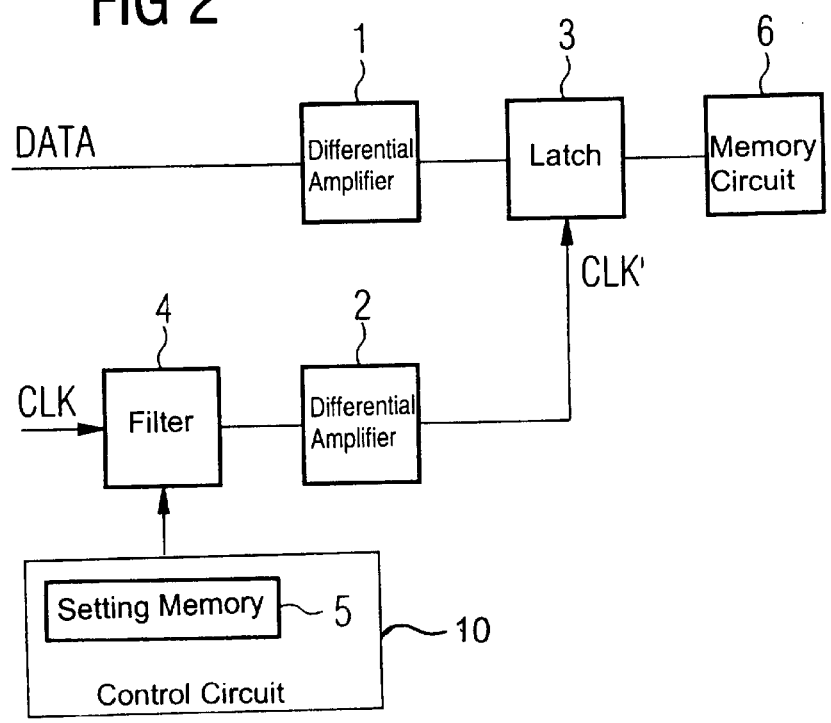
FIG. 2 is a block diagram of an input circuit for an integrated circuit having a data input and a clock input.

FIG. 2 shows a block diagram of an input circuit for a semiconductor memory circuit 6, having a data input DATA for a data signal and a clock input CLK for a clock signal. The data signal and the clock signal are represented by alternating voltage levels on the respective signal lines. In the integrated circuit, the voltage levels of the signals are assigned logical signal values that respectively correspond to particular voltage values. The voltage levels of the data signal are converted in a data differential amplifier 1, and the clock signal is converted in a clock differential amplifier 2, these amplifiers interpreting signal voltage levels above a reference voltage as logic "1" and assigning a high voltage level. Voltage values that are below the reference voltage level are assigned a logic "0", i.e. to a low voltage potential.

In this way, the data signal DATA in the data differential amplifier 1 is converted into a digital signal and is transferred to a latch 3, for example. It is transferred to the latch 3 by a transfer signal CLK'. The rising and falling edges of the transfer signal CLK' indicate the instant at which the data value of the data signal is transferred to the latch 3. The data item stored in the latch 3 can then be transferred from there to the semiconductor memory circuit 6.

The transfer signal CLK' is formed from the clock signal CLK by using a filter circuit 4 to filter out a particular frequency, a particular frequency range or a plurality of frequency ranges. The clock signal filtered in this manner is digitized in the clock differential amplifier 2 in the same way as the data signal and is made available as a transfer signal CLK'.

The filter circuit 4 is preferably in the form of an inverse bandpass filter that can filter out a particular frequency range from the clock signal CLK. The frequency range to be filtered is preferably chosen such that at least the frequency of the main interference source is filtered out. It is merely necessary to ensure that the frequency range of the filter circuit 4 is not in the range containing the fundamental frequency of the clock signal. Provision can also be made for a plurality of frequencies or frequency ranges also to be filtered out of the clock signal when there are a plurality of interference sources.

The frequencies or frequency ranges to be filtered can be set by a setting memory 5 that is connected to the filter circuit 4 and is part of a control circuit 10. In this case, the setting memory 5 can be modified in the test procedure or during operation of the integrated circuit. The setting in the memory 5 stores values for frequencies or frequency ranges which are transmitted to the filter circuit 4, as a result of which the filter circuit 4 is set for the purpose of filtering the frequencies or frequency ranges.

The invention makes provision for the receiver circuits for the data signals and the clock signals on an integrated circuit, such as a semiconductor memory circuit 6, to take different forms. While interference suppression using the filter circuit 4 is of little expediency for a data signal, since this reduces the edge gradient of the data signal, it is appropriate to use the filter circuit 4 for the clock signal in order to remove interference from the clock signal CLK, so that a transfer signal CLK' is produced. This allows the data in the data signal to be transferred to the latch 3 at a correct instant.

The features of the invention that are disclosed in the description above, in the claims and in the drawings can be significant both individually and in any desired combination for the purpose of implementing the invention in its various embodiments.

We claim:

1. An integrated circuit, comprising:
   a clock input for receiving a clock signal;
   a receiver circuit; and
   a filter circuit having an input connected to said clock input for filtering out at least one of a frequency and a frequency range of the clock signal, said filter circuit having an output and generates a filtered clock signal available at said output, said output connected to said receiver circuit and said receiver circuit receiving the filtered clock signal, said receiver circuit forwarding the filtered clock signal for further processing.

2. The integrated circuit according to claim 1, further comprising a control circuit having a setting memory connected to said filter circuit, said setting memory storing setting values and said control circuit controlling said filter circuit on a basis of the setting values.

3. The integrated circuit according to claim 2, wherein said control circuit controls filtering properties of said filter circuit.

4. The integrated circuit according to claim 2, wherein said setting memory stores at least one filter frequency and at least one filter frequency range which need to be filtered out by said filter circuit.

5. The integrated circuit according to claim 1, wherein said receiver circuit has a differential amplifier circuit.

6. The integrated circuit according to claim 1, wherein said filter circuit is part of a digital circuit.

7. The integrated circuit according to claim 2, wherein said setting memory stores at least one filter frequency which needs to be filtered out by said filter circuit.

8. The integrated circuit according to claim 2, wherein said setting memory stores at least one filter frequency range which needs to be filtered out by said filter circuit.

9. The integrated circuit according to claim 1, wherein the integrated circuit is configured for use with a semiconductor memory circuit.

* * * * *